TUNING INDICATOR

Filed May 13, 1949

2 SHEETS—SHEET 1

INVENTOR.
HAROLD E. BESTE
BY Darby & Darby
ATTORNEYS

Aug. 5, 1952

H. E. BESTE 2,606,239

TUNING INDICATOR

Filed May 13, 1949

2 SHEETS—SHEET 2

INVENTOR.
HAROLD E. BESTE

BY Darby & Darby
ATTORNEYS

Patented Aug. 5, 1952

2,606,239

UNITED STATES PATENT OFFICE 2,606,239

TUNING INDICATOR

Harold E. Beste, Verona, N. J., assignor to Allen B. Du Mont Laboratories, Inc., Passaic, N. J., a corporation of Delaware Application May 13, 1949, Serial No. 93,069

8 Claims. (Cl. 177—311)

This invention relates to tuning mechanisms for radio and television receivers and to means for indicating the frequency or station to which the receiver is tuned.

An object of my invention is to provide an improved, convenient and easily understood tuning indication, particularly where a large range of tunable frequencies are to be indicated.

Further objects of my invention may be apparent by referring to the specification, claims and drawing in which:

Figure 1:
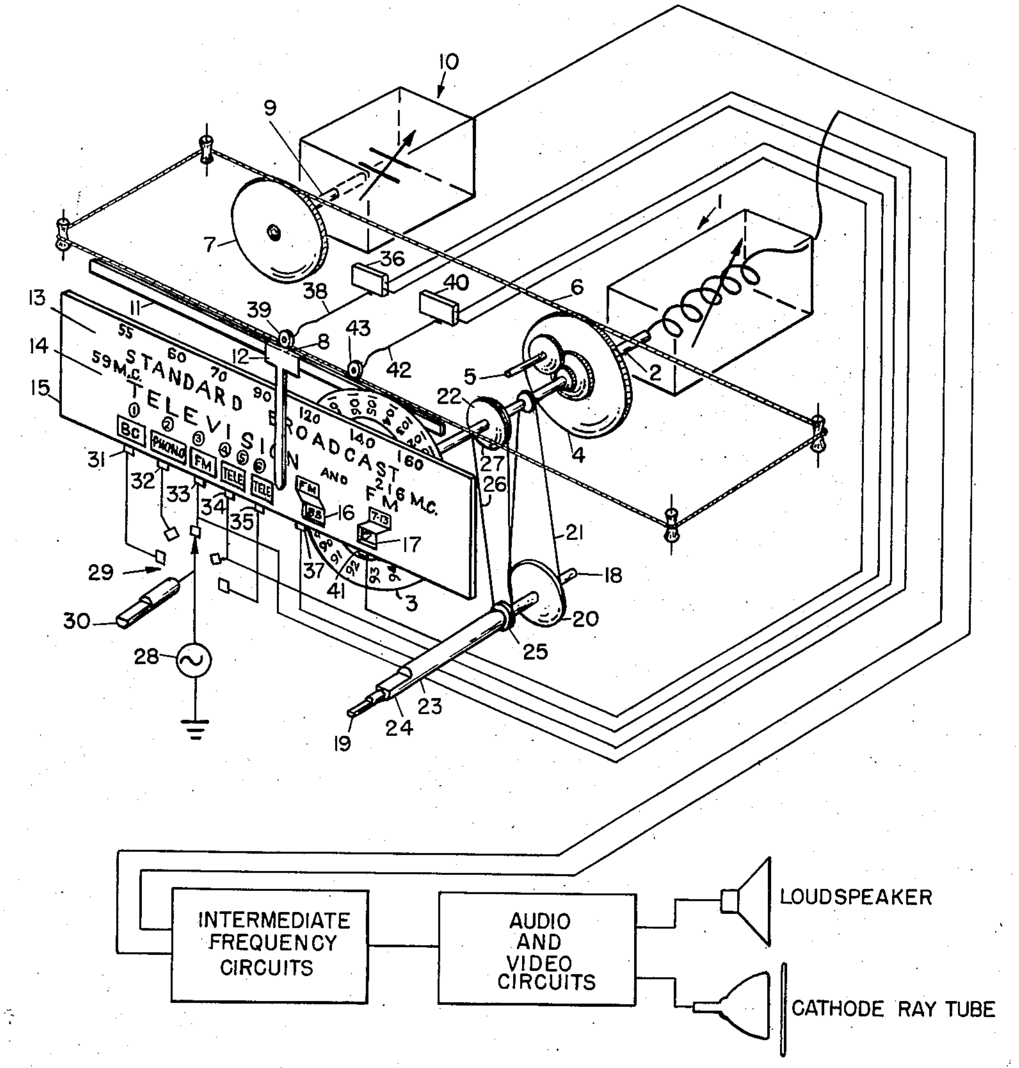
Figure 1 is a perspective view of the dial and tuning mechanism, showing electrical connections in schematic form.
Figure 2:
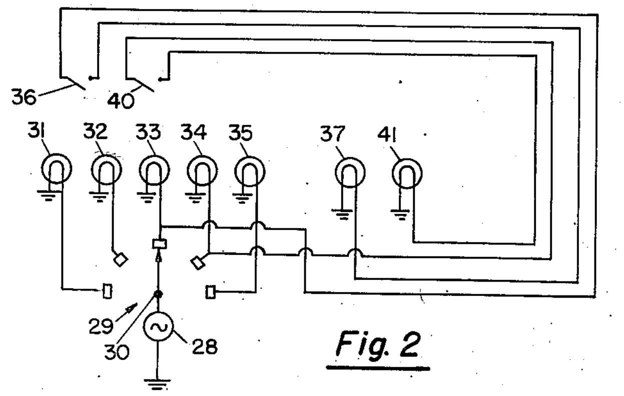
Figure 2 is a schematic diagram of the electrical connections used in the invention.
Figure 3:
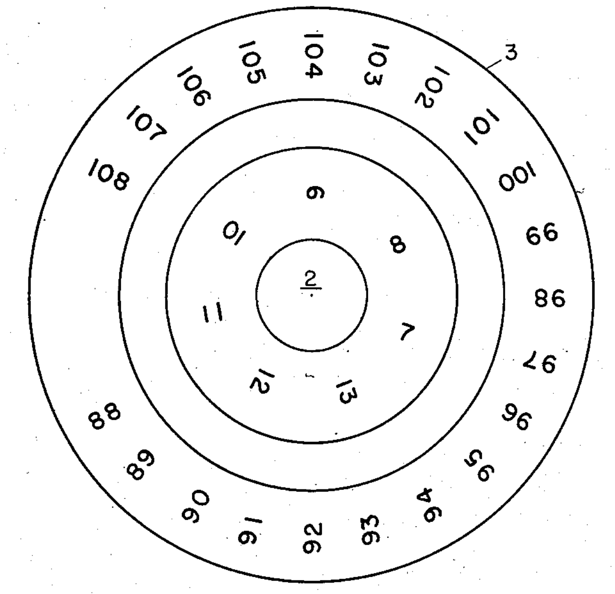
Figure 3 shows a dial disc and the preferred indicia thereon.

A tuning mechanism 1 for a television and radio receiver may tune continuously over a wide range of frequencies such as for instance between 49 and 216 megacycles, which range of frequencies according to present standards, includes lower band television, frequency modulation, additional services, and high band television. The lower band television frequencies are according to present allocations broadcast at 49.75, 59.75, 65.75, 71.75, 81.75 and 87.75 megacycles per second and are known, respectively, as television channels 1 through 6, inclusive. The frequency modulation or FM band is between 88 and 108 megacycles per second and contains 100 separate channels. The upper television band contains broadcast frequencies at 179.75, 185.75, 191.75, 197.75, 203.75, 209.75, and 215.75 megacycles per second and are known, respectively, as channels 7 through 13, inclusive. The frequencies between 108 and 174 megacycles per second, on the tuning mechanism described and on similar mechanisms, are not presently allocated for broadcast services.

The tuning mechanism 1 is coupled by means of a shaft 2 to a rotating dial 3. A drum 4 is rotatably mounted on the shaft 2 and geared thereto by means of idler shaft 5, the number of gear teeth in the preferred form being such that the drum 4 makes one revolution to cover the range of the tuning mechanism 1 while the shaft 2 simultaneously makes 10 revolutions.

The drum 4 is mechanically linked by means of a cord or cable 6 to a second drum 7, and also to a slider 8. This latter drum 7 is attached to a shaft 9, by means of which a second tuning mechanism 10, in this case a ganged tuning condenser, is tuned through the amplitude modulated broadcast band of 550 to 1600 kilocycles per second. A fixed plate member 15 has a scale 13 for broadcast frequencies and also a scale 14 for television and FM formed thereon. A pointer 12 attached to a slider 8 riding on a track 11 provides the tuning indicator.

The dial 3 is mounted immediately behind the plate 15. A slot 16 in this plate 15 permits numerals on the dial 3 to be seen. These numerals indicate the frequencies of the FM band to which the tuning mechanism 1 is tuned. These figures appear with each of the 10 rotations of the shaft 2, but are used only during the time that the pointer 12 indicates the portion of the scale 14 marked "F. M." The attention of the observer is further attracted to the numbers on the dial 3 by means of illumination dependent upon the position of the slider 8, as will be explained more fully hereinafter.

A second slot 17 in the plate 15 permits additional numbers on the dial 3 to be seen. These numbers show the higher television channels, and are referred to when the pointer 12 indicates the portion of the scale 14 covering the higher frequency television bands and marked "7–13." When the pointer is in this position, the attention of the observer is further attracted to the vernier dial by means of illumination, as will be explained.

In the preferred form of my invention, the entire tuning and indicating apparatus described above is actuated by means of a double drive mechanism which is described as follows:

A fast drive shaft 18 is formed to receive a knob (not shown) on the end 19 thereof to facilitate manual rotation. A drum 20 attached to this shaft 18 actuates a cord or belt 21, which cord or belt in turn engages another drum 22 on the shaft 2, causing the latter to be rotatable by means of the knob at the shaft end 19.

Similarly, a slow drive shaft 23, coaxial with the fast drive shaft 18 is slotted at its end 24 to receive a second knob (not shown), preferably larger than the first knob, so that delicate manual adjustment may be accomplished for fine tuning. A drum 25 is attached to the shaft 23 for driving a cord or belt 26 engaging another drum 27 attached to the shaft 2.

An advantage of the cord or belt drives shown is that the tuning mechanism is protected, by the slipping of the belts, from damage which might otherwise result from careless forcing of the tuning knob when the tuning mechanisms have reached the limits of their travel.

The means for illumination of the vernier dials referred to above can be explained as follows:

A source of electrical power 28, which preferably is a 6.3 voltage source also used to energize the heaters of many of the tubes in the receiver, is connected in series with a switch 29. This switch, here shown as a five-position switch, may conveniently be part of a wafer on the band switch of the set. As shown, the switch can be turned by means of shaft 30 successively through five positions, namely standard broadcast, phonograph, frequency modulation, television tuning, and television viewing. As the switch is turned each of five appropriate dial indicator lamps 31, 32, 33, 34 and 35 is illuminated in turn.

In addition to the above, in the FM position of the switch, the source of power 28 may be connected by means of a microswitch 36 to a dial lamp 37. The microswitch 36 is actuated by means of a lever arm 38 at the end of which is a roller 39. The roller 39 is so placed that it intercepts the line of travel of the slider 8 when the mechanism 1 is tuned to receive FM signals.

Similarly, when the switch is in the television tuning position, the source of power 28 may be connected by means of a second microswitch 40 to a second dial lamp 41. This microswitch 40 is actuated by a lever arm 42 and a roller 43 so placed that it intercepts the line of travel of the slider 8 when the mechanism 1 is tuned to receive signals in the upper television band.

The method of operation is as follows: When the switch is turned to indicate standard broadcast frequencies, this is so indicated by the indicator lamp 31 which lights up the letters "BC." Tuning is accomplished by the manual rotation of the shaft end 19, or for fine tuning, the shaft end 24. Either of these shafts so actuated transmit motion to shaft 2 by means of cords and pulleys 20, 21 and 22 or 25, 26 and 27. By means of the geared idler shaft 5 this motion is translated to the drum 4. By means of the cord 6 this motion is transmitted to the drum 7, and to the shaft 9 which actuates the broadcast tuning mechanism 10. At the same time the cord 6 actuates the slider 8, and the pointer 12 sliding over the scale 13 indicates the frequency to which the mechanism 10 has been tuned.

When the switch 29 is in phonograph position, the indicator lamp 32 illuminates the letters "phono" so indicating.

When the switch 29 is in frequency modulation position, this is so indicated by the lamp 33 which illuminates the letters "F. M." By means of shaft ends 19 or 24 the pointer 12 is moved as described before, until it intercepts the portion of the scale 14 marked "F. M." When this has been done, the position of the slider 8 actuates the microswitch 36 and illuminates the portion of the dial 3 which can be seen through the opening 16 of the main plate 15. The frequencies of the 100 FM channels are thus shown on the vernier dial.

To tune in television stations, the switch 29 is put in the fourth or television tuning position. In this position the bright letters "tele" are illuminated. The lower channel stations can be tuned in by turning shaft ends 19 and 24 as before until the pointer 12 lies over the appropriate channel number. To tune in the upper television channels the pointer 12 is moved to the right hand end of the scale 14 where the numbers "7–13" appear. When the pointer 14 is in this position, the second microswitch 40 closes, illuminating the portion of the vernier dial 3 under the second aperture 17. As the shaft 2 tunes the mechanism 1 to the proper frequencies, the appropriate channel number appears through the aperture 17 (shown in dotted lines in the drawing since in the position shown the pointer 12 indicates that the mechanism 1 is tuned to receive FM signals).

After the television station has been properly tuned, the switch may be moved to its fifth or television viewing position. In this position the indicator lamp 34, which illuminates the main scale 14, is turned off, as is also the lamp 41 in the event the set is tuned to one of the channels in the high television band. In its stead, the switch 29 applies power to a dimly illuminated lamp 35 which does not detract from the enjoyment of viewing the television program.

Although a preferred embodiment of my invention has been illustrated and described, it will be evident to those skilled in the art that many modifications in the apparatus may be made without departing from the scope of my invention. Also, the microswitches 36 and 40 shown actuated by the slider 8 might be actuated by other means or might be replaced by equivalent mechanisms. Also, the combination of the large drum 4 and the idler shaft 5 geared to it might be replaced by a mechanical equivalent.

What is claimed is:

1. In a receiver of multiband frequency signals, the combination of two tuning mechanisms, each said mechanism being provided with a separate rotatable tuning shaft and a drum attached thereto, a frequency indicating means containing scales calibrated in indicia of frequencies tunable by each of said respective mechanisms, and a mechanical linkage comprising a cable engaging each said drum and said indicating means.

2. A tuning and indicating device for a receiver of high frequency waves comprising a tuning mechanism continuously tunable over a range of signal frequencies, a first indicator containing a scale calibrated in indicia of said frequencies within said range, a second indicator containing a scale calibrated in indicia of frequencies within a limited portion of said range, said indicators being coupled to said mechanism by means of a mechanical linkage, and a switch actuated by said first indicator when said mechanism is tuned within said portion of said range and operable to render more visible said second indicator.

3. A tuning and indicating device for a receiver of high frequency waves comprising a tuning mechanism continuously tunable over a range of signal frequencies, a first indicator containing a scale calibrated in indicia of said frequencies within said range, a second indicator containing a scale calibrated in indicia of frequencies within a limited portion of said range, said indicators being coupled to said mechanism by means of a mechanical linkage, a switch actuated by said first indicator when said mechanism is tuned within said portion of said range, and an indicator lamp positioned to illuminate said second indicator and connected in electrical circuit with said switch.

4. A tuning and indicating device for a receiver of high frequency waves comprising a tuning mechanism continuously tunable over a range of signal frequencies, a first indicator containing a scale calibrated in indicia of said frequencies within said range, a second indicator containing a scale calibrated in indicia of frequencies within a limited portion of said range, said indicators being coupled to said mechanism by means of a mechanical linkage, a switch actuated by said first indicator when said mechanism is tuned within said portion of said range, a manually operated switch, and an indicator lamp positioned to illuminate said second indicator and connected in electrical circuit with both of said switches.

5. A tuning and indicating device for a receiver of high frequency waves comprising a tuning mechanism continuously tunable over a range of signal frequencies, a first indicator containing a scale calibrated in indicia of said frequencies within said range, a second indicator visible within the periphery of said first indicator and containing a scale calibrated in indicia of frequencies within a limited portion of said range, said indicators being coupled to said mechanism by means of a mechanical linkage, and a switch actuated by said first indicator when said mechanism is tuned within said portion of said range and operable to render more visible said second indicator.

6. A tuning and indicating device for a receiver of high frequency waves comprising a tuning mechanism continuously tunable over a range of signal frequencies, a first indicator containing a scale calibrated in indicia of said frequencies within said range, a second indicator containing a scale calibrated in indicia of frequencies within a first limited portion of said range and second scale calibrated in indicia of frequencies within a second limited portion of said range, said indicators being coupled to said mechanism by means of a mechanical linkage, a first switch actuated by said first indicator when said mechanism is tuned within said first limited portion, a second switch actuated by said first indicator when said mechanism is tuned within said second limited range, a first indicator lamp positioned to illuminate said first scale and connected in electrical circuit with said first switch, and a second indicator lamp positioned to illuminate said second scale and connected in electrical circuit with said second switch.

7. In a receiver for receiving a plurality of kind of input signals, each said kinds of signal being broadcast within a limited portion of frequency spectrum, a tuning mechanism tuning continuously over a frequency range sufficiently large to embrace both said portions of spectrum, a first indicator containing a scale calibrated in indicia of said frequencies within said range, a second indicator containing a scale calibrated in indicia of frequencies within one of said limited portions, said indicators being coupled to said mechanism by means of a mechanical linkage, a switch actuated by said first indicator when said mechanism is tuned within one of said limited portions, and a visual indicator connected in electrical circuit with said switch to indicate which of said two types of signals said receiver is tuned to receive.

8. In a receiver for receiving a plurality of kinds of input signals, said receiver containing a function switch for changing the operation of said receiver from a condition optimum for reception of one of said kinds of signals to a condition optimum for reception of another of said kinds, each said kind of signal being broadcast within a limited portion of frequency spectrum, a tuning mechanism tuning continuously over a frequency range sufficiently large to embrace both said portions of spectrum, a first indicator containing a scale calibrated in indicia of said frequencies within said range, a second indicator containing a scale calibrated in indicia of frequencies within one of said limited portions containing said one of said kinds of signals and a second scale calibrated in indicia of frequencies within another of said limited portions containing said other of said kinds of signals, said indicators being coupled to said mechanisms by means of a mechanical linkage, a second switch actuated by said first indicator when said mechanism is tuned within said one of said limited portions, and a visual indicator connected in electrical circuit with both said switches to indicate both the tuning of said mechanism within said one of said bands and the proper setting of said function switch to receive the kind of said kinds broadcast within said one of said bands.

HAROLD E. BESTE.

REFERENCES CITED

The following references are of record in the file of this patent:

UNITED STATES PATENTS

| Number | Name | Date |
|---|---|---|
| 1,850,640 | Sperry | Mar. 22, 1932 |
| 1,987,857 | Lewis | Jan. 15, 1935 |
| 2,132,094 | Brodton | Oct. 4, 1938 |
| 2,176,673 | Krause | Oct. 17, 1939 |
| 2,441,233 | Beers | May 11, 1948 |